United States Patent
Tsai et al.

(10) Patent No.: US 9,337,250 B2
(45) Date of Patent: May 10, 2016

(54) SEMICONDUCTOR PACKAGE AND METHOD OF MANUFACTURING THE SAME

(71) Applicant: Siliconware Precision Industries Co., Ltd, Taichung (TW)

(72) Inventors: Tsung-Hsien Tsai, Taichung (TW);
Heng-Cheng Chu, Taichung (TW);
Chien-Cheng Lin, Taichung (TW);
Chih-Hsien Chiu, Taichung (TW);
Hsin-Lung Chung, Taichung (TW);
Yude Chu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/087,554

(22) Filed: Nov. 22, 2013

(65) Prior Publication Data

US 2014/0203395 A1 Jul. 24, 2014

(30) Foreign Application Priority Data

Jan. 22, 2013 (TW) .............................. 102102301 A

(51) Int. Cl.
*H01L 49/02* (2006.01)
*H01L 23/64* (2006.01)
(Continued)

(52) U.S. Cl.
CPC ................ *H01L 28/00* (2013.01); *H01L 23/64* (2013.01); *H01L 24/32* (2013.01); *H01L 25/16* (2013.01); *H01L 25/50* (2013.01);
(Continued)

(58) Field of Classification Search
CPC .............. H01L 23/4012; H01L 25/117; H01L 27/1255; H01L 28/10; H01L 28/20; H01L 28/40; H01L 2924/1421; H01L 28/00; H01L 25/16; H01L 25/50; H01L 24/32; H01L 23/64; H01L 23/3135; H01L 23/3128; H01L 2224/32225; H01L 2224/73265; H01L 2924/15311; H01L 2224/48091; H01L 2224/48227; H01L 2924/19103
USPC .......................................... 257/528, 686, 724
See application file for complete search history.

(56) References Cited

U.S. PATENT DOCUMENTS

| | | | |
|---|---|---|---|
| 6,593,662 B1 * | 7/2003 | Pu et al. ......................... | 257/777 |
| 6,781,222 B2 * | 8/2004 | Wu et al. ........................ | 257/684 |
| 7,382,056 B2 * | 6/2008 | Chiu et al. ..................... | 257/777 |
| 8,026,129 B2 * | 9/2011 | Cablao et al. ................. | 438/109 |
| 8,241,956 B2 * | 8/2012 | Camacho et al. ............. | 438/109 |

(Continued)

OTHER PUBLICATIONS http://www.merriam-webster.com/dictionary/surround; 2015.*

*Primary Examiner* — Yu Chen
*Assistant Examiner* — Nilufa Rahim
(74) *Attorney, Agent, or Firm* — Mintz Levin Cohn Ferris Glovsky and Popeo, P.C.; Peter F. Corless; Steven M. Jensen

(57) ABSTRACT

A semiconductor package and a method of manufacturing the same are provided. The semiconductor package includes: a substrate having a plurality of conductive lands and a plurality of bonding pads surrounding the conductive lands formed on a surface thereof; a plurality of passive devices mounted on the conductive lands; an insulation layer formed on the surface and having a portion of the passive devices embedded therein; a semiconductor chip mounted on a top surface of the insulation layer; a plurality of bonding wires electrically connecting the semiconductor chip and the bonding pads; an encapsulant formed on the surface of the substrate to encapsulate the insulation layer, the bonding wires and the semiconductor chip, wherein a region of the semiconductor chip projected onto the substrate covers a portion of an outermost one of the passive devices. Therefore, the mounting density of the passive devices is improved.

3 Claims, 3 Drawing Sheets

(51) Int. Cl.
*H01L 23/00* (2006.01)
*H01L 25/16* (2006.01)
*H01L 25/00* (2006.01)
*H01L 23/31* (2006.01)

(52) U.S. Cl.
CPC ........ *H01L 23/3128* (2013.01); *H01L 23/3135* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01); *H01L 2924/19103* (2013.01)

(56) References Cited

U.S. PATENT DOCUMENTS

| | | | |
|---|---|---|---|
| 2008/0029869 A1* | 2/2008 | Kwon et al. | 257/686 |
| 2008/0093723 A1* | 4/2008 | Myers et al. | 257/686 |
| 2011/0278712 A1* | 11/2011 | Hu et al. | 257/686 |
| 2012/0273971 A1* | 11/2012 | Usami | 257/777 |
| 2013/0009311 A1* | 1/2013 | Lin et al. | 257/762 |
| 2013/0049179 A1* | 2/2013 | Desai et al. | 257/666 |
| 2013/0076570 A1* | 3/2013 | Lee et al. | 343/700 MS |
| 2013/0256840 A1* | 10/2013 | Yun et al. | 257/620 |
| 2013/0341784 A1* | 12/2013 | Lin et al. | 257/737 |
| 2014/0191419 A1* | 7/2014 | Mallik et al. | 257/777 |

* cited by examiner

SEMICONDUCTOR PACKAGE AND METHOD OF MANUFACTURING THE SAME

CROSS-REFERENCES TO RELATED APPLICATIONS

This application claims under 35 U.S.C. §119(a) the benefit of Taiwanese Application No. 102102301, filed Jan. 22, 2013, the entire contents of which is incorporated herein by reference.

BACKGROUND OF THE INVENTION

1. Field of the Invention

The present invention relates to semiconductor packages and methods of manufacturing the same, and, more particularly, to a wire-bonding-type semiconductor package and a method of manufacturing the same.

2. Description of Related Art

With the development of electronic industry, electronic products at the market have demands for light weight, compact size, high performance and multi functions. The achievement of an ideally light, compact and fast electronic product depends on developments of high memory capacity, high operation frequency and low voltage requirement of IC components. However, the high memory capacity, high operation frequency and low voltage requirement of IC components continuously improve upon the density of electronic circuits and elements on an IC component and the density of I/O connectors providing transmission for electronic circuit signals and power.

In order to contain more electronic components, such as capacitors, resistors, inductors, RF passive devices and other passive components to satisfy the needs of the industry, BGA semiconductor device is thus developed.

However, some semiconductor devices, such as communication or RF semiconductor devices, usually need to electrically connect a plurality of passive components such as resistors, inductors, capacitors and RF passive devices to a packaged semiconductor chip, and thus the semiconductor chip has a specified current characteristic. A BGA semiconductor device, for example, although has a plurality of passive components arranged on the substrate surface, in order to prevent those passive components from blocking electrical connections and arrangements between the semiconductor chip and a plurality of conductive lands. Traditionally, those passive devices are arranged at corner positions of a substrate or layout areas of a substrate in addition to mounting regions of semiconductor chips.

Nevertheless, the limited arranging positions of passive devices will reduce the routability of a circuit layout, and positions of conductive lands further result in a limited arrangement numbers of those passive devices, which is disadvantageous for the development trends of a high integration of a semiconductor device. Additionally, the arrangement numbers of passive devices dramatically increase in response to a demand for high performance of a semiconductor package. In the prior art, the substrate surface has to contain a plurality of semiconductor chips and more passive devices, which may cause an increase of package substrate areas, and force an increase of a package volume, and does not accord to the development trends of a compact semiconductor package.

Please referring to FIG. 1, based on above problems, a conventional semiconductor package 1 has a plurality of passive devices arranged on a region between a semiconductor chip 13 and conductive lands 100. However, with the increased numbers of I/O connectors on a unit area in a semiconductor device, the numbers of bonding wires 14 also increase and generally the height of a passive device 11 (0.8 mm) is higher than a semiconductor chip 13 (0.55 mm). In order to prevent a bonding wire 14 from contacting a passive device 11 causing a short circuit, the bonding wire 14 have to be pulled up and cross over the passive device 11, which increase the bonding difficulty and the length of a wire loop. Further, since the weight of the bonding wire 14 itself, the pulled up bonding wire 14 may sag and contact to the passive device 11 causing a short circuit if there is no support for the bonding wire 14. Moreover, the bonding wire 14 is made by gold and aluminum materials, this method not increase the complexity of a manufacture process, but the increased length of a bonding wire 14 wire loop also significantly raise the cost of the bonding wire 14.

Therefore, how to prevent above problems of the prior art is substantially an issue desirably to be solved in the industry.

SUMMARY OF THE INVENTION

In view of the above problems in the prior art, the present invention provides a semiconductor package, comprising: a substrate having a plurality of conductive lands and a plurality of bonding pads surrounding the conductive lands formed on a surface thereof; a plurality of passive devices mounted on the conductive lands of the substrate; an insulation layer formed on the surface of the substrate and having a portion of the passive devices embedded therein; a semiconductor chip mounted on a top surface of the insulation layer, wherein a region of the semiconductor chip projected onto the substrate covers a portion of an outermost one of the passive devices; a plurality of bonding wires electrically connecting the semiconductor chip and the bonding pads; and an encapsulant formed on the surface of the substrate to encapsulate the insulation layer, the bonding wires and the semiconductor chip.

The present invention further provides a method of manufacturing a semiconductor package, comprising: providing a substrate having a plurality of conductive lands and a plurality of bonding pads surrounding the conductive lands formed on a surface thereof; mounting a plurality of passive devices on the conductive lands and electrically connecting the passive devices to the conductive lands; forming an insulation layer on the substrate surface and having a portion of the passive devices embedded therein; mounting a semiconductor chip on a top surface of the insulation layer and electrically connecting the semiconductor chip to the bonding pads with a plurality of bonding wires, wherein a region of the semiconductor chip projected onto the substrate covers a portion of an outermost one of the passive devices; and forming an encapsulant on the substrate surface to encapsulate the insulation layer, the bonding wires and the semiconductor chip.

In one embodiment of the semiconductor package according to the present invention, the projection region of the semiconductor chip onto the substrate covers the outermost one of the passive devices, wherein the passive device protrudes 0.1 to 1.5 mm from the edge of the projected region to prevent the short-circuit problem caused by the contact between the prior bonding wire and a passive device.

In the semiconductor package according to the present invention, the passive devices comprise Non-RF passive devices and RF passive devices.

From the above, the semiconductor package and the method of manufacturing the same according to the present invention overcomes a drawback in the prior art that passive devices are arranged at substrate corners or additional arranged on the substrate by mounting the semiconductor chip on an insulation layer having passive devices embedded therein. Therefore, the arrangement density of passive devices is effectively increased.

In addition, the semiconductor package and the method of manufacturing the same of the present invention further reduce the complexity of the manufacture process and effectively reduce the length of a bonding wire loop by enabling the semiconductor chip projected perpendicularly on the substrate to completely or partially cover the outermost passive devices.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "surround", "top", "protrude", "projected" and "one" in this specification are only for the convenience to describe, not for limiting the scope of embodiment in the present invention. Those changes or adjustments of relative relationship without substantial change of technical content should also be considered within the category of implementation.

First Embodiment

FIGS. 2A-2D are cross-sectional views illustrating a method of manufacturing a semiconductor package of a first embodiment according to the present invention.

Figure 1:
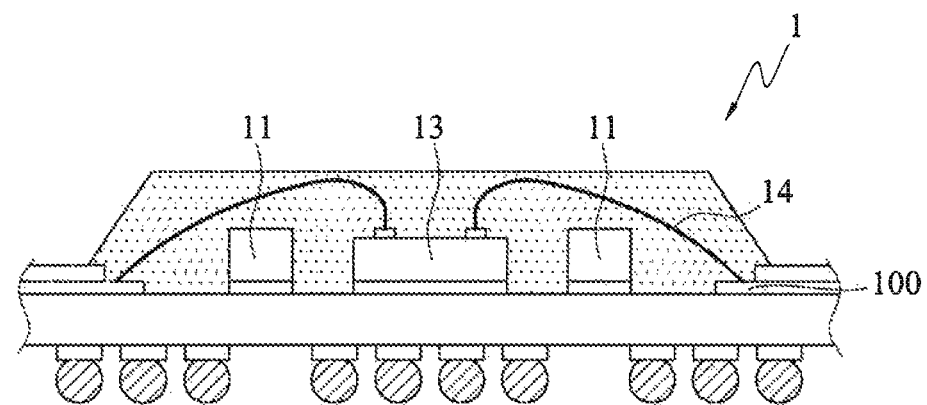
FIG. 1 is a cross-sectional view of a semiconductor package according to the prior art.
Figure 2A:
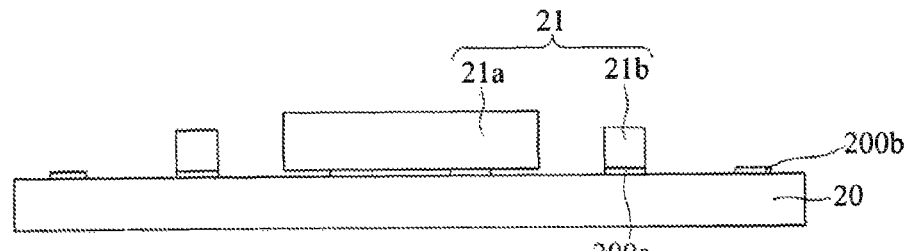
FIGS. 2A-2D are cross-sectional views illustrating a method of manufacturing a semiconductor package of a first embodiment according to the present invention.

As shown in FIG. 2A, a substrate 20 having a plurality of conductive lands 200a and a plurality of bonding pads 200b surrounding the conductive lands 200a formed on a surface thereof is provided, a plurality of passive devices 21 are mounted on and electrically connected to the conductive lands 200a, and the passive devices 21 comprise at least one RF passive device 21a, such as a quartz oscillator, a T/R switch or a filter, and a plurality of Non-RF passive devices 21b, such as resistors, capacitors and inductors. The Non-RF passive devices 21b surround the periphery of the at least one RF passive device 21a.

Figure 2B:
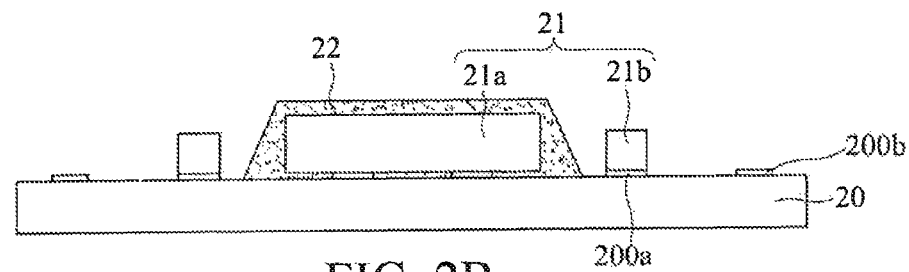

As shown in FIG. 2B, an insulation layer 22 is formed on the surface of the substrate 20 and having the at least one passive device 21a embedded therein.

In an embodiment, there is no specific limitations in a forming method and a material for the insulation layer 22, description thereof is omitted.

Figure 2C:
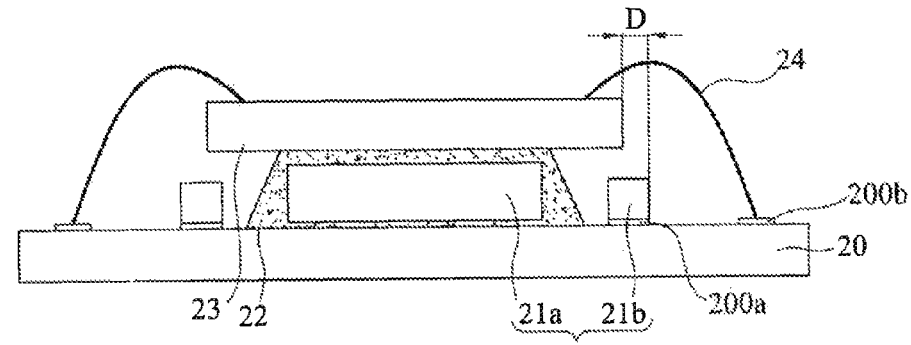

As shown in FIG. 2C, a semiconductor chip 23 is mounted on a top surface of the insulation layer 22, and the semiconductor chip 23 is electrically connected to the bonding pad 200b of the substrate 20 with bonding wires 24. A portion of the Non-RF passive devices 21b protrudes a distance D from a region of the semiconductor chip 23 projected onto the substrate 20, that is, the region of the semiconductor chip 23 projected onto the substrate 20 covers a portion of an outermost one of the passive devices 21.

Figure 2D:
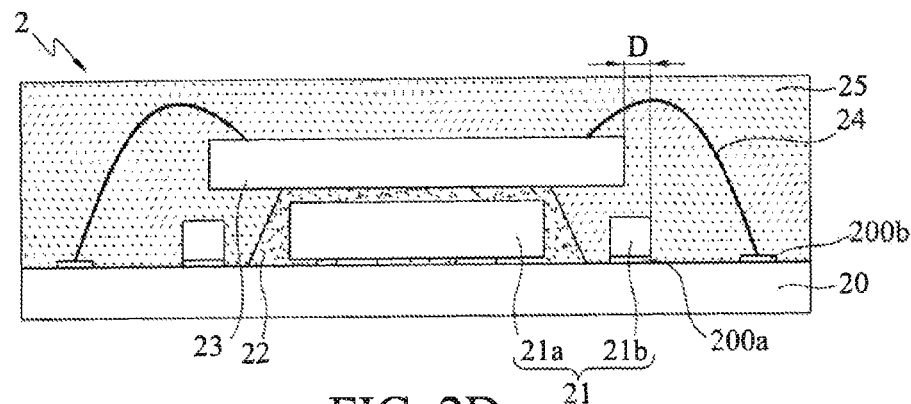

As shown in FIG. 2D, an encapsulant 25 is formed on the surface of the substrate 20 to encapsulate the insulation layer 22, the semiconductor chip 23, the Non-RF passive devices 21b and the bonding wires 24 to manufacture a semiconductor package 2 of the present invention.

In an embodiment, a forming method and a material for the encapsulant 25 thereof is omitted.

After a practical test of the first embodiment, it is found that when the distance D is between 0.1 to 1.5 mm, the short-circuit problem caused by the contact between a Non-RF passive device 21b and a bonding wire 24 which is utilized for electrically connecting the semiconductor chip 23 and bonding pad 200b is effectively prevented.

Second Embodiment

Figure 3:
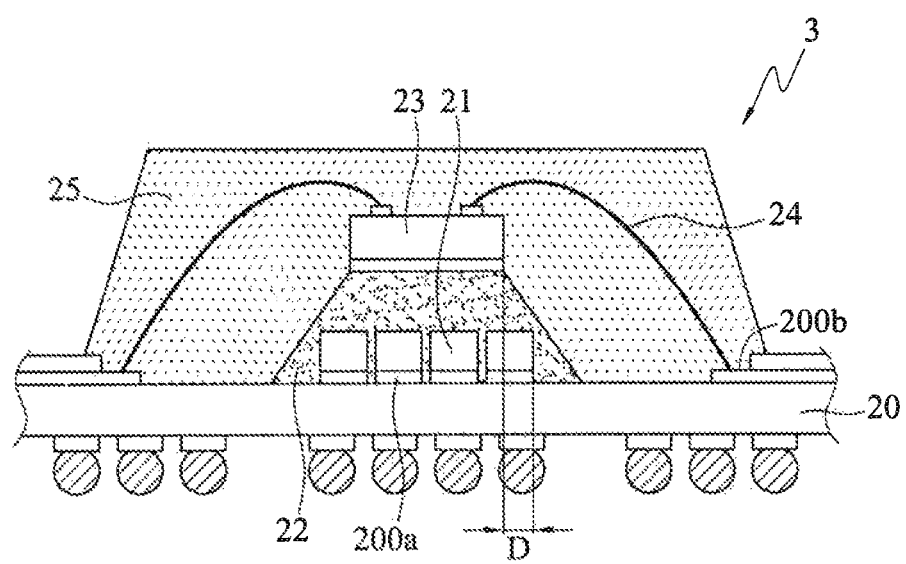
FIG. 3 is a cross-sectional view of a semiconductor package of a second embodiment according to the present invention.

FIG. 3 is a cross-sectional view of a semiconductor package 3 of a second embodiment according to the present invention. The second embodiment differs from the first embodiment in that in the second embodiment the insulation layer 22 covers the passive devices 21, the outermost one of the passive devices 21 protrudes a distance D from a region of the semiconductor chip 23 projected onto the substrate 20 covers, and the distance D is between 0.1 to 1.5 mm. The method of the second embodiment is understood by persons skilled in the art based on this specification and reference drawings, and thus a description thereof is omitted.

In an embodiment, the passive devices 21 are Non-RF passive devices or RF passive devices, wherein the Non-RF passive devices comprise, but are not limited to a resistor, a capacitor and a inductor, and the RF passive devices comprise, but are not limited to a quartz oscillator, a T/R switch and a filter.

The present invention also provides a semiconductor package 2, 3, comprising: a substrate 20 having a plurality of conductive lands 200a and a plurality of bonding pads 200b surrounding the conductive lands 200a formed on a surface thereof; a plurality of passive devices 21 mounted on the conductive lands 200a of the substrate 20; an insulation layer 22 formed on the surface of the substrate 20 and having a portion of the passive devices 21 embedded therein; a semiconductor chip 23 mounted on a top surface of the insulation layer 22, wherein a region of the semiconductor chip 23 projected on the substrate 20 covers a portion of an outermost one of the passive devices 21; a plurality of bonding wires 24 electrically connecting the semiconductor chip 23 and the bonding pads 200b; and an encapsulant 25 formed on the surface of the substrate 20 to encapsulate the insulation layer 22, the bonding wires 24 and the semiconductor chip 23.

In an embodiment, the outermost one of the passive devices 21 protrudes a distance D from a region of the semiconductor chip 23 projected onto the substrate 20 covers, and the distance D is between 0.1 to 1.5 mm.

In an embodiment, the passive devices 21 comprise a plurality of Non-RF passive devices 21b and a RF passive device 21a.

In an embodiment, the RF passive device 21a is covered by the insulation layer and the Non-RF passive devices 21b surround the periphery of the RF passive device 21a.

In summary, the semiconductor package and the method of manufacturing the same according to the present invention arrange passive devices on a substrate and then a semiconductor chip over the passive devices. Therefore, not only the drawback in the prior art that passive devices are arranged at substrate corners or additional arranged on the substrate is overcome, the arrangement density of passive devices is also increased effectively. In addition, the semiconductor package and the method of manufacturing the same according to the present invention further prevent the short-circuit problem caused by the contact between the prior bonding wire and a passive device by enabling the semiconductor chip projected perpendicularly on the substrate to completely or partially cover the outermost passive device.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A semiconductor package, comprising:
   a substrate having a plurality of conductive lands and a plurality of bonding pads surrounding the conductive lands formed on a surface thereof;
   a plurality of passive devices mounted on the conductive lands of the substrate;
   an insulation layer formed on the surface of the substrate, with a portion of the passive devices embedded therein;
   a semiconductor chip mounted on a top surface of the insulation layer, wherein an entire region of the semiconductor chip projected onto the substrate covers only a portion of an outermost one of the passive devices, and the outermost one of the passive devices protrudes 0.1 to 1.5 mm from the entire region of the semiconductor chip projected onto the substrate, wherein the passive devices comprise a plurality of non-RF passive devices and at least one RF passive device;
   a plurality of bonding wires electrically connecting the semiconductor chip and the bonding pads; and
   an encapsulant formed on the surface of the substrate to encapsulate the insulation layer, the bonding wires and the semiconductor chip.

2. The semiconductor package of claim 1, wherein the at least one RF passive device is covered by the insulation layer.

3. The semiconductor package of claim 1, wherein the Non-RF passive devices surround a periphery of the at least one RF passive device.

* * * * *